United States Patent [19]

Rapps et al.

[11] 4,453,104
[45] Jun. 5, 1984

[54] LOW-PROFILE CRYSTAL PACKAGE WITH AN IMPROVED CRYSTAL-MOUNTING ARRANGEMENT

[75] Inventors: Gary M. Rapps, Sunrise; Alvin Feder, Lauderhill, both of Fla.

[73] Assignee: Motorola, Inc., Schaumburg, Ill.

[21] Appl. No.: 377,289

[22] Filed: May 12, 1982

[51] Int. Cl.³ .............................................. H01L 41/08
[52] U.S. Cl. .................... 310/348; 310/320; 310/366
[58] Field of Search .............. 310/348, 320, 324, 366; 29/25.35

[56] References Cited

U.S. PATENT DOCUMENTS

| | | |
|---|---|---|
| 3,656,217 | 4/1972 | Scott, Jr. et al. |
| 3,723,920 | 3/1973 | Sheahan et al. |
| 3,735,166 | 5/1973 | Bradley |
| 3,754,153 | 8/1973 | Carpenter et al. |
| 3,851,193 | 11/1974 | Ritter |
| 3,916,490 | 11/1975 | Sheahan et al. |
| 3,988,825 | 11/1976 | Fuchs et al. |
| 4,017,752 | 4/1977 | Kakehi et al. |
| 4,103,264 | 7/1978 | Howatt et al. |
| 4,143,508 | 3/1979 | Ohno |

Primary Examiner—Mark O. Budd
Attorney, Agent, or Firm—Charles L. Warren; James W. Gillman; Edward M. Roney

[57] ABSTRACT

A low-profile crystal package wherein the wire bonding operation from the electrode pattern of the crystal plate to the terminal posts may be accomplished without fear of fracture of the crystal plate itself. The crystal blank is positioned on a support member which in turn initially sits on a ring of indium. In this position, the crystal blank is not in contact with the split center support post whose top surface is covered with indium paste, and is supported around its periphery during wire bonding. When all the wire bonding operations are effectuated, the assembly is subjected to sufficient heat wherein the indium material will melt, which will cause the support member to be drawn downward, thereby resulting in the crystal plate being supported and fastened only by the center supports, with the periphery of the crystal plate being free to vibrate with no extraneous dampened support.

9 Claims, 4 Drawing Figures

LOW-PROFILE CRYSTAL PACKAGE WITH AN IMPROVED CRYSTAL-MOUNTING ARRANGEMENT

BACKGROUND OF THE INVENTION

The present invention relates in general to crystal mounting arrangements for quartz crystal packages and more particularly to a low-profile crystal package with an improved crystal mounting arrangement which facilitates multiple electrical connections to each surface of the crystal plate without flexing or repositioning the crystal plate.

It has long been the practice to hermetically seal the protective metal crystal package. Once sealed, the crystal package can be used in many different environments with a high degree of relative confidence that the internal crystal plate will perform at the desired frequency.

In recent years, space limitations have required smaller and smaller crystal mounting assemblies, which has caused an increase in the electrical and mechanical problems relative to adequately fixturing a crystal plate within a crystal package, while not causing damage to the crystal plate, maintaining frequency standardization and avoiding internal environmental contamination during the sealing process. Likewise, as crystal applications have become more and more complex, more electrical contact points are required, on smaller and smaller crystal plates. Thus, it has been the prior-art practice to provide a small crystal package which allows the mounting of the crystal plate within a metal evacuated container, such container having terminal pins projecting within the internal cavity which are connected via wire leads to the electrodes found on the crystal plate. These same terminal pins also serve to support the unit within the evacuated cavity as its seams are sealed either by soldering, hot-welding, or cold-welding technologies.

The use of high-pressure cold-welding technology has found favor in the prior art since it has the primary advantage of being free from fumes and contamination; due to the pressures involved, it has an occasional disadvantage of causing distortion to the metal container during the welding operation, which may result in the internal terminal pins being displaced from their intended positions. Since the crystal plate is secured by the terminal pins, will cause a stress force to be applied to the crystal plate, which will have negative consequences to the frequency characteristics of the crystal plate. The present invention is concerned with a crystal package that is preferably hermetically sealed by the utilization of cold welding apparatus, but is not limited to solely the cold welding technological art.

In the prior art there are various types of crystal mounting apparatus which are in common usage. In one approach, the quartz crystal wafer is supported by the center mounting post, which allows the horizontal mounting of the crystal and reduces the overall height of the crystal package assembly. A disadvantage of this crystal mounting approach is that the crystal plate needs to be adequately supported during the wire bonding process so as to withstand the surface pressures involved without sustaining damage to the crystal plate. During assembly of the crystal wafer onto its respective center post mounting position, it is desirable to avoid overstressing the wafer. Such stresses can occur by the means which are used to mount the crystal wafer in the crystal package or by the mechanical stresses which develop during the hermetic sealing of the crystal package itself.

The prior art sealing techniques have generally consisted of the steps of hermetically sealing a pair of terminals in an eyelet to form a header, mounting a crystal wafer on an associated header, and hermetically sealing the header to a metal or glass container, with the crystal wafer positioned within such container. Headers have been characterized either as matched glass or compression glass headers. In a glass header, a single vitreous material is used to fabricate the terminals and eyelets, while a second vitreous material which has the same thermal co-efficient of expansion as the eyelet and terminals is used to seal the terminals to the eyelet. Generally, the eyelet and terminals are made of an iron-nickel-cobalt alloy material such as KOVAR and the vitreous material is a glass which has been selected to have a thermal co-efficient expansion substantially the same as that of KOVAR. The sealing process is facilitated by placing molten glass in the eyelet around the terminals and then cooling the glass to cause it to shrink and tightly grip the terminals. The similar coefficients of thermal expansion of the KOVAR components and the vitreous material insure that the seal between the terminals and the eyelet will be maintained. In both the matched and the compression glass headers the integrity of the terminal to eyelet seal depends upon the attainment of a good seal between the terminal and the glass.

A disadvantage common to all of the prior-art devices is the relatively high cost and complexity which exists for the various crystal package apparatus.

SUMMARY OF THE INVENTION

It is therefore an object of the present invention to provide an improved five-spot cold-welded crystal package wherein the foregoing deficiencies found in the prior art are overcome.

Another object of this invention is to provide an improved low-profile crystal package containing a crystal mounting arrangement which will allow the internal crystal wafer to be placed on a flat surface of an internal support member will allow the wire bonding to a plurality of internal header pins without repositioning the crystal plate for additional assembly operations.

Still another object of the invention is to provide an improved crystal package which is hermetically sealed and which will accommodate an associated crystal plate, having a top- and bottom-electrode pattern, to be wire-bonded to the associated connecting header pins in such a manner as not to flex the crystal plate, once positioned on the flat surface of internal support members.

A further object of this invention is to provide the crystal plate with a stationary and temporary support while wire bonding is effectuated, then allow the support member to automatically cease being a support member to the crystal plate without flexing or repositioning the crystal plate located within the support member.

A further object of the present invention is to improve the center-mount method of crystal mountings by allowing a crystal plate to be firmly supported and protected during the wire bonding of the multiple spot electrode pattern to the appropriate header terminal pins either by manual or automated wire bonding processes without damaging the crystal plate.

Yet another object of the present invention is to provide a five-spot cold-welded crystal package which is of low cost, of simple design and can be readily and easily manufactured.

In practicing the invention, a method of stationing a crystal plate within a low profile package assembly is provided for accommodating a horizontally mounted crystal plate, with an associated electrode pattern on each top and bottom surface, in such a manner as to provide support and protection to the crystal plate during the wire-bonding manufacturing step. A split mounting post is centrally located within the glass header base member, said header base member having a plurality of locating pins and a specified number of terminal connecting pins. A circular ring of conductive material, which is of a predetermined size and of a material conducive to melting, is centrally positioned on the top surface of the glass header base in such a manner as to encircle the center split mounting post. An elongated support member with an inner centrally located recessed cavity and aperture, is positioned atop the circular ring. This elongated support member positions itself over the two locating pins located on the glass header base member. The crystal plate with its conductive electrode areas formed on each surface thereof is located within the flat recessed cavity of said support member, said plate being supported around its total peripheral edge. Conventional wire bonds are made between the contact pads on the crystal plate and the correct terminal pins of the glass header base member. Pressure is then applied, via the use of a weighted fixture or other appropriate means, to the top surface of the support member which is heated to the melting point of the conductive material. This will cause the circular ring to melt and the ring to experience a decrease in overall thickness. The melted conductive material will fuse to the top of the glass header base member, resulting in the crystal plate being suspended and mounted atop the center split ground post. A protective overfitting metal cover is then hermetically sealed to the glass header base member through the use of cold welding apparatus.

BRIEF DESCRIPTION OF THE DRAWINGS

The features of the present invention which are believed to be novel are set forth with particularity in the claims. The invention itself, however, together with further objects and advantages thereof, may be best understood by reference to the following description when taken into conjunction with the accompanying drawings, in which like reference numerals refer to like elements in several figures, and in which:

DETAILED DESCRIPTION OF THE PREFERRED EMBODIMENT

Figure 1:
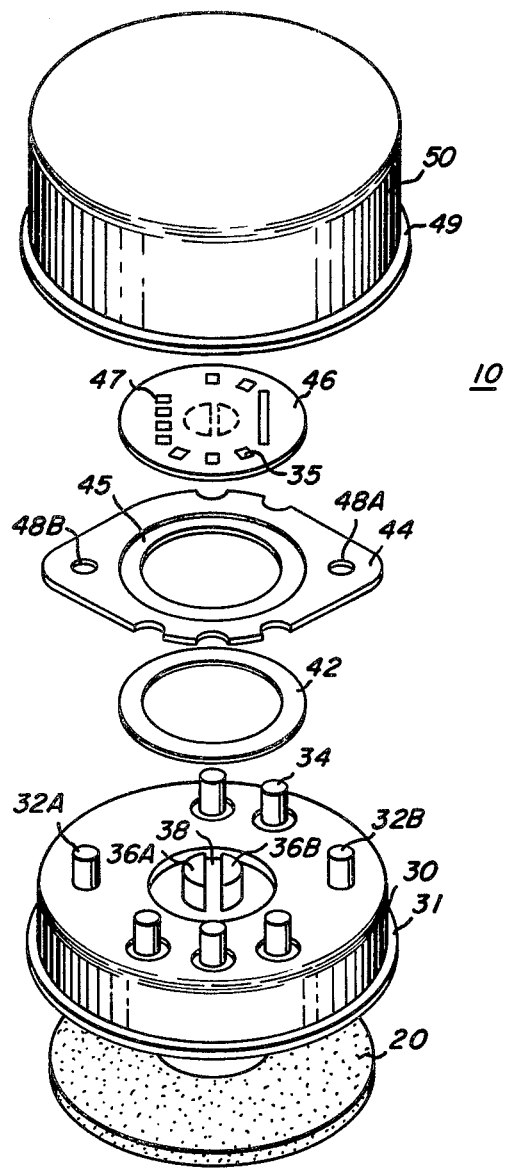
FIG. 1 is an exploded view of a crystal package assembly, constructed in accordance with the present invention.

Referring now to the drawings, FIG. 1 shows an exploded view of the individual elements comprising the crystal package assembly 10, which has been constructed in accordance with the present invention. A glass header assembly 30 consists of two locating pins 32A and 32B, five terminal connecting pins 34, and a center split mounting post 38. The plurality of terminal connecting pins 34 need to be of a electrically conductive material, one of which is KOVAR, but is not limited to this particular commercially suitable material. The bottom of the exposed center mounting post and the bottom of the five connecting pins are flush with the bottom surface of the glass header (not shown). The center split mounting post 38 protrudes above the glass header and has two independent sides, 36A and 36B. A ring of indium 42, or other conductive and meltable material, is placed on the glass header, over which is placed a support member 44. The support member 44 has a recessed center cavity 45 and two female apertures 48A and 48B which accomodate the locating pins 32A and 32B. The associated crystal plate 46 has electrode patterns represented at 47, on its top and bottom surfaces and is dimensioned to fit within the cavity 45 of the support member 44. This is accomplished in a manner to enable the crystal plate 46 to be placed on a flat surface within the cavity 45. In this position, the crystal blank 46 is not in contact with the center mounting post 38 and is supported around its periphery by the recessed cavity 45 of the support member 44 during the wire bonding process. A small amount of Indium paste is placed atop the center mounting post 38 (not shown). The crystal plate 46 is then wire bonded, utilizing associated wire bonding pads 35, which are located on the top surface of the crystal plate 46, to the five terminal connecting pins 34, which connect to the appropriate electrode patterns 47 (connection not shown). Pressure is applied by suitable means such as a weighted fixture (not shown) to the top support member 44 and the entire glass header assembly is heated to 157° C., the melting point of indium. As the indium ring 42 melts, its thickness will decrease and it will fuse to the top of the header 30, thereby pulling the support member 44 down, that the edge of the crystal plate 46 is no longer supported by the support member 44. The melted indium material will wick into the surrounding recessed areas around the center split ground post 38, forming a semi-seal between the glass header and the center split ground post. The crystal will then remain suspended only on the two independent ground sides 36A and 36B of the center mounting post 38, with the periphery of the crystal plate being free to vibrate with no extraneous dampened support. The protective metal cover 50 is snuggly over-fitted to the header assembly 30 is such a manner as to align edge 49 with header base member extending flange 31. The whole unit is thereafter cold-welded to hermetically seal the unit. A conductive elastomer pad 20, or other means to make electrical connection, will act as a bridge from the bottom portions of the pins 34 of the glass header assembly to the circuitry of the electronic device (not shown).

Figure 2:
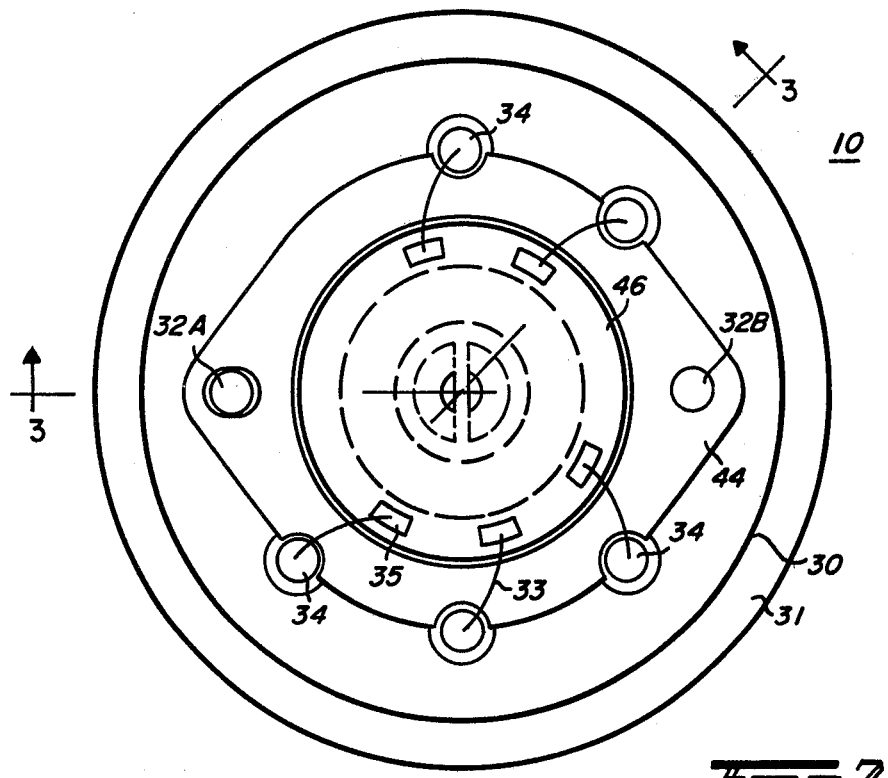
FIG. 2 is a top plan view of the assembly according to the invention illustrating the crystal plate positioned on the header base member, after wire bonding the contact pads of the crystal plate to the appropriate terminal pins has been facilitated.

In FIG. 2 a plan view of the glass header assembly is shown after wire bonding is completed but before the unit is hermetically sealed through a cold welding process. The glass header assembly 10 illustrates the locating pins 32A and 32B, the plurality of terminal connecting pins 34, and the associated crystal plate 46 with its wire bonding contact pads 35. Wire bonds 33 are made in customary fashion between the wire bond pads 35 on the crystal 46 and a like number of terminal connecting pins 34. The wire bonds are of an extremely fine wire and are normally formed in a arch as shown, to reduce transmission of vibration to the crystal during operation.

Figure 3:
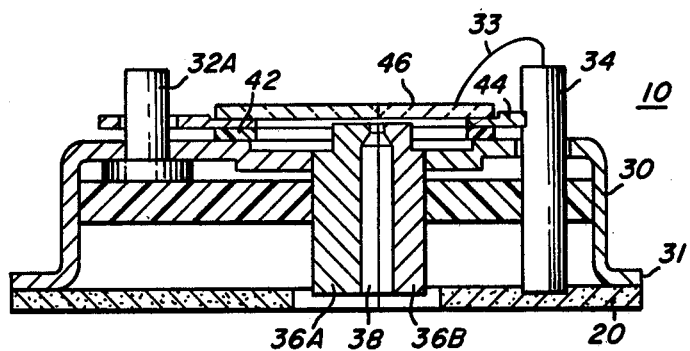
FIG. 3 is a cross-sectional view along the lines 3—3 of FIG. 2 showing the support member in a position prior to the indium ring being melted.

In FIG. 3 a sectional view along lines 3—3 of FIG. 2 is illustrated before the support member 44 has been lowered by the melting of the indium ring 42. The crystal plate 46 rests securely within the recess 45 (not shown) of the support member 44, but without touching the center split mounting posts's two independent ground sides 36A and 36B.

Figure 4:
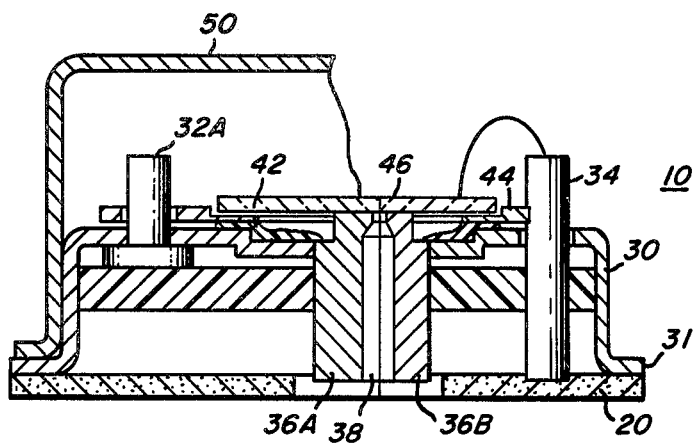
FIG. 4 is a sectional side view along line 3—3 of FIG. 2 illustrating the lowered position of the support member after the melting of the Indium ring and after the cold-welding process has sealed the outer metallic cover to the internal header base.

In FIG. 4 a sectional view along lines 3—3 of FIG. 2 is illustrated after the support member 44 has been lowered following the melting of the indium ring 42 and after the crystal package assembly 10 has been hermetically sealed by the cold welding process.

This simple construction allows the crystal electrodes on the top surface of crystal plate 46 to be wire bonded to the terminal connecting pins 34 without flexing or repositioning the crystal plate once the crystal plate has been placed in the recess cavity contained within the support member 44. The glass header 30 has a extending flange 31 which facilitates the receiving of the overfitting metal cover 50, which is then sealed through the use of cold-welding process.

Thus, there has been provided according to the invention, an improved, simple and inexpensive five spot crystal package which will allow the crystal plate to be adequately supported after initial placement within a retaining support member, allowing wire bonding of the crystal plate electrodes to the terminal pins and hermetically sealing the assembly by a cold welding process. Although the foregoing has been an description and illustration of specific embodiments of the invention, various modification and changes thereto can be made by persons skilled in the art within the scope and spure of the invention as defined by the following claims.

What is claimed is:

1. A low-profile crystal package assembly comprising in combination:
    a crystal plate having a plurality of conductive electrode patterns on each surface thereof;
    a base member which consists of a plurality of keyed locating pins and terminal connecting pins, and a mounting post;
    a support member, sufficiently large to receive an associated crystal plate within a centrally located cavity and keyed for positioning around the locating pins and terminal connecting pins;
    a plurality of wire bonds connecting the various terminal connecting pins to the appropriate electrode patterns of the crystal plate; and
    a ring of conductive meltable material intended to provide temporary support of said support member and crystal plate during wire bonding operations to said crystal plate, and which has been melted and allowed to wick into the interior of said base member to provide a semi-seal therebetween and said mounting post.

2. A low-profile crystal package assembly comprising in combination:
    a crystal plate having a plurality of conductive electrode patterns on each surface thereof;
    a base member which consists of a plurality of keyed locating pins, a plurality of keyed terminal connecting pins, a center mounting post consisting of two independent ground sections, and an flange extending around the periphery of the lower edge of said base member;
    a support member, sufficiently large to receive an associated crystal plate within a centrally located cavity and keyed for positioning around the locating pins and terminal connecting pins;
    a plurality of wire bonds connecting the various terminal connecting pins to the appropriate electrode patterns of the crystal plate;
    a ring of conductive meltable material intended to provide temporary support of said support member and crystal plate during wire bonding operations to said crystal plate, and which has been melted and allowed to wick into the interior of said base member to provide a semi-seal therebetween and said mounting post;
    a conductive elastomer base to provide the necessary electrical contact with the bottom of the terminal pins and the center mounting post to the circuitry of the associated electronic device; and
    an overfitting protective metal cover which is hermetically sealed to the base member.

3. A low-profile crystal package assembly in accordance with claim 1 or 2, wherein the ring of conductive material consists of indium.

4. A low-profile crystal package assembly in accordance with claim 1 or 2, wherein the base member consists of a glass header base member.

5. A low-profile crystal package assembly in accordance with claim 1 or 2, wherein the crystal mounting post is centrally located within the base member.

6. A low-profile crystal package assembly in accordance with claim 1 or 2, wherein said crystal plate is peripherally supported about its peripheral bottom surface by the associated support member during wire bonding of the crystal's electrode pattern to the appropriate terminal pins.

7. A low-profile crystal package assembly in accordance with claim 1 or 2, wherein a quartz crystal plate, having a top and bottom electrode pattern, can be electrically connected to the base member of the package assembly without flexing or repositioning the crystal plate during additional assembly operations of the crystal package.

8. A low-profile crystal package assembly in accordance with claim 1 or 2, wherein said package assembly will contain five pins for connecting the top electrodes and a bottom split mounting post for connecting the bottom electrode patterns therein without transferring, flexing or repositioning the crystal plate during additional assembly operations of the crystal package.

9. A low-profile crystal package assembly in accordance with claim 2, wherein said base member has peripheral flanges formed therein which contact certain complimentary top flanges of the protective metal cover and such are cold welded together to form a unified protective package.

* * * * *